United States Patent [19]

Rzeszewski

[11] 4,389,637

[45] Jun. 21, 1983

[54] DIGITAL TO ANALOG CONVERTER

[75] Inventor: Theodore S. Rzeszewski, Lombard, Ill.

[73] Assignee: Matsushita Electric Corp. of America, Franklin Park, Ill.

[21] Appl. No.: 293,194

[22] Filed: Aug. 17, 1981

Related U.S. Application Data

[62] Division of Ser. No. 118,495, Feb. 4, 1980, abandoned.

[51] Int. Cl.³ ............................................. H03K 13/02
[52] U.S. Cl. ............................... 340/347 DA; 377/42; 377/52
[58] Field of Search ............... 340/347 AD, 347 DA, 340/347 MT; 235/310, 92 CV, 92 PE

[56] References Cited

U.S. PATENT DOCUMENTS

| | | | |
|---|---|---|---|
| 3,178,564 | 4/1965 | Klahn | 235/310 |
| 3,576,575 | 4/1971 | Hellwarth | 340/347 DA |
| 3,646,545 | 2/1972 | Naydan | 340/347 DA |
| 4,117,476 | 9/1978 | Koyanagi | 340/347 DA |
| 4,258,355 | 3/1981 | Edwards | 340/347 DA |

Primary Examiner—C. D. Miller
Attorney, Agent, or Firm—Lavalle D. Ptak

[57] ABSTRACT

A digital to analog converter utilizes a digital missing pulse detector as a time interval measuring means in which the detector includes a programmable counter, the count of which is set to correspond with the digital number or word to be converted. Clock pulses at a high frequency are applied to advance the programmable counter from a reset condition to a terminal or output condition, and the time interval produced depends upon the binary word or number set into the programmable counter. Pulses at a second lower frequency, equal to the repetition rate of the system, are applied to the input of the time interval measuring circuit; so that the output is a series of pulse width modulated pulses having a duty cycle corresponding to the binary word originally set into the programmable counter. A low pass filter is connected to the output of the time interval measuring circuit and provides an analog output signal at a voltage level corresponding to the binary number or word originally set into the programmable counter.

3 Claims, 3 Drawing Figures

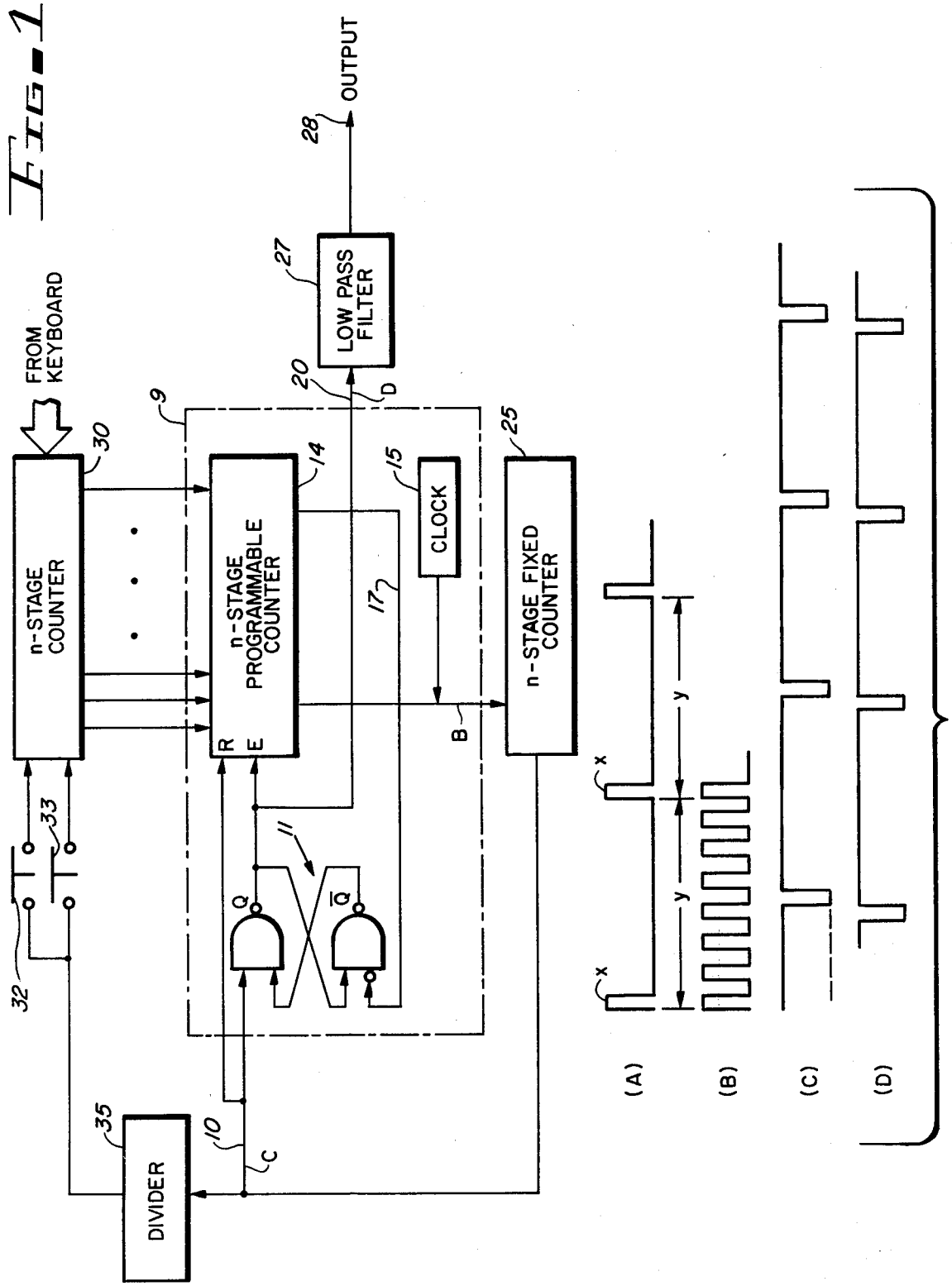

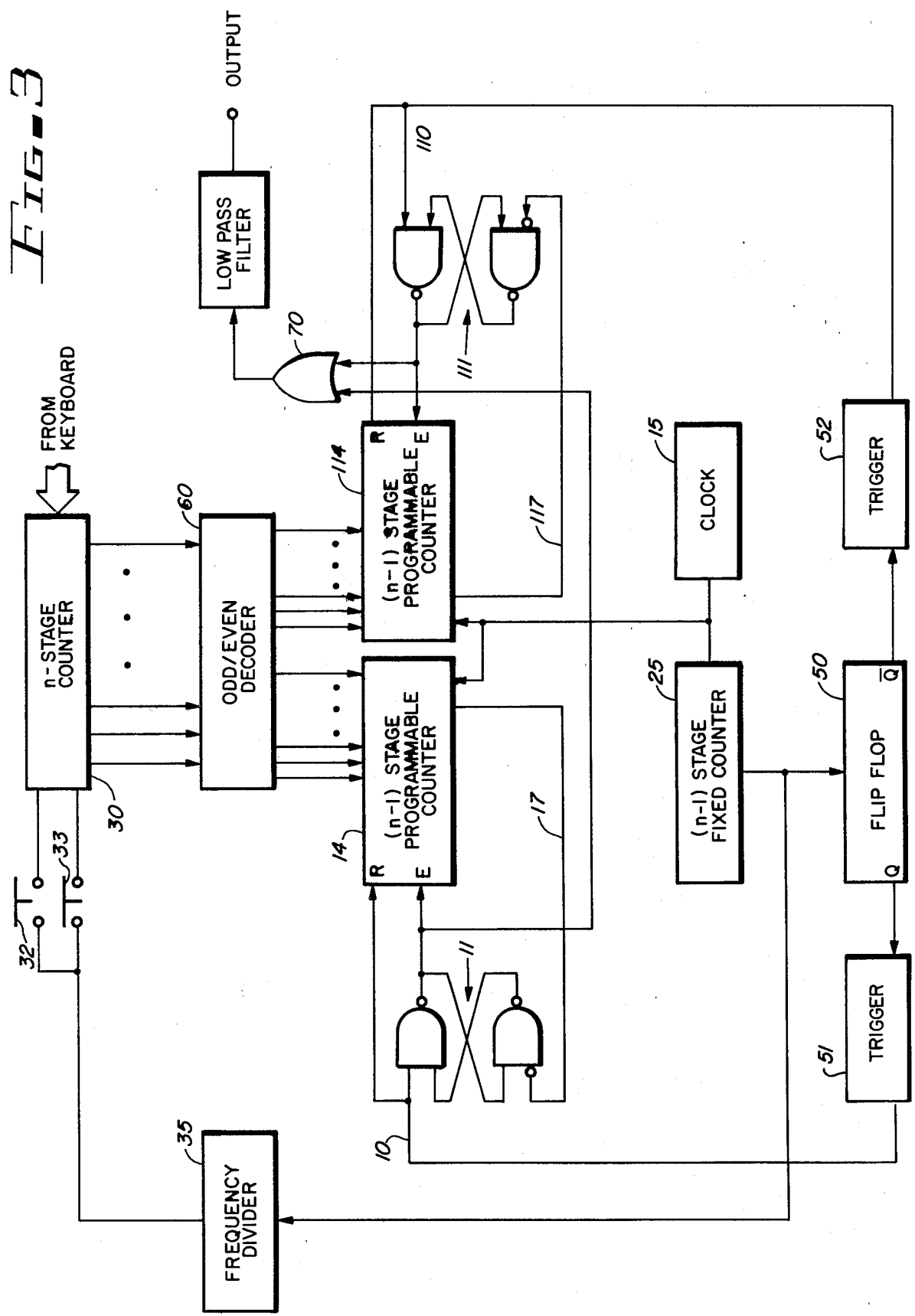

DIGITAL TO ANALOG CONVERTER

This is a division of application Ser. No. 118,495, filed Feb. 4, 1980 now abandoned.

BACKGROUND OF THE INVENTION

Digital to analog conversion systems are widely used for the purpose of converting binary words or numbers to an analog digital signal utilized for various purposes, such as the control of the tuning of a television receiver and the like. Digital to analog conversion may be implemented in a number of ways. A common approach in the past has been to use resistors in a binary weighted fashion. Such a system requires, for an n-digit binary number, n switches, one for each bit; a weighted resistive network; a reference voltage; and a summing element that adds the currents flowing in the resistive network. Obviously, such a system is restricted to only a small number of bits in the maximum sized binary word because of the large resistor range that results for n weighted resistors. Another difficulty is in maintaining the exact resistance ratios.

A more common approach which has been utilized in the past is what is known as the "R-2R" ladder network. Here the resistors all are either R or 2R in relative value and, consequently, the entire network is easier to implement than the weighted resistor type of converter. A resistor ladder converter, however, still requires very close matching of the resistors; and when the accuracy required from the converter becomes high (n becomes large), the technique becomes difficult because of the difficulty in matching the resistors.

In addition, both of the above resistor based systems for a digital to analog converter are at a substantial disadvantage for implementation in an LSI circuit; because they require a large number of pin-outs equal in number to the maximum number, n, of binary bits or digits of the largest binary word capable of being converted by the system.

In an attempt to overcome the problems which exist in implementing resistor networks into integrated circuit form and to substantially reduce the large power consumption which necessarily is inherent with a resistive network, digital to analog converters which are digital in nature have been developed. One such approach is disclosed in the patent to Ehni, U.S. Pat. No. 3,968,440. FIGS. 13 and 15 of the Ehni patent show a digital to analog converter requiring a relatively complex memory network in order to effect the desired conversion.

Another approach which utilizes digital techniques in a digital to analog converter in the form of a combined pulse rate and pulse width modulation circuit is disclosed in the patent to Ong, U.S. Pat. No. 4,096,475. This patent is directed to a system where the digital signal to be converted is changed to a periodically occuring series of digital comparison signals used to produce a number of pulses per period which increases or decreases by the value of the digital number being converted. To accomplish this the Ong system requires counters and a number of 4-bit magnitude comparator circuits of a relatively complex nature in order to effect the desired conversion. The output of the comparator network then is passed through a low-pass filter to produce the desired analog voltage.

Other techniques have been developed employing adder circuits, shift registers, and gating networks in place of the prior resistor ladder networks to produce pulse width modulated interim outputs. These outputs then are filtered to produce the desired analog output voltages. Systems of this type known to applicant are generally complex, requiring a large number of components to produce the pulse width modulated output signals utilized as the input to a low pass filter for producing the analog output voltage. Examples are the systems shown in the patents to Kaszynski, U.S. Pat. No. 3,422,423, issued Jan. 14, 1969; Mogi et al, U.S. Pat. No. 4,058,772, issued Nov. 15, 1977; Mogi, U.S. Pat. No. 4,139,840, issued Feb. 13, 1979; Buss, U.S. Pat. No. 4,093,921, issued June 6, 1978; and Dummermuth, et al., U.S. Pat. No. 3,754,235, issued Aug. 21, 1973.

It is desirable to provide a digital to analog converter circuit which is essentially entirely digital in operation except for the output filter used to develop the analog output voltage, and which is simple to implement even for the conversion of relatively large binary numbers. Furthermore, such a circuit should be capable of implementation into LSI technology, or the like, with a minimum number of input and output pins or bonding pads required.

SUMMARY OF THE INVENTION

Accordingly, it is an object of this invention to provide an improved digital to analog converter.

It is another object of this invention to provide an accurate digital to analog converter.

It is an additional object of this invention to provide a digital to analog converter which may be readily implemented in integrated circuit form.

It is a further object of this invention to provide a digital to analog converter system which is synchronous in operation.

It is yet another object to this invention to provide a digital to analog converter system utilizing pulse width modulation techniques requiring a minimum number of components and which is synchronous in operation.

It is another object of this invention to provide a digital to analog converter system of the pulse width modulation type that requires less filtering than conventional pulse width modulation approaches.

In accordance with a preferred embodiment of this invention, a digital to analog converter includes a first time interval measuring circuit which has a multi-stage programmable counter in it. The counter is interconnected with other circuit elements having an input and an output for providing a first output state on the output of the interval measuring circuit when the interval between input pulses applied to its input is less than a first preestablished amount and which provides a second output state on the output whenever the interval between the input pulses is more than a first amount. A source of clock signals is coupled with the counter to advance the count in it from an initial reset condition to an output pulse producing condition in response to some predetermined number or clock pulses. This number of clock pulses is the number of pulses necessary to establish the interval of the time interval measuring means and is dependent upon the programming of the counter. The programming of the counter, in turn, is established by the binary or digital number to be converted. Finally, input pulses are applied to the input terminal of the time interval measuring circuit at a frequency which is lower than the frequency of the clock pulses where the interval between successive pulses at this lower frequency establishes the repetition rate related to the number of digits in the binary number on which the conversion is being performed.

BRIEF DESCRIPTION OF THE DRAWINGS

FIG. 1 is a block diagram of a preferred embodiment of the invention;

FIG. 2 illustrates pulse waveforms useful in explaining the operation of the circuit shown in FIG. 1; and FIG. 3 is a block diagram of another embodiment of the invention.

DETAILED DESCRIPTION

In the drawings, the same reference numbers are used to designate the same or similar components throughout the different Figures. Also, reference is made to a "digital counter" and this term is intended to encompass all types of counting circuits which are advanced in response to clock pulses to attain different counts indicative of the number of clock pulses applied to them. Such counters, for example, may be clocked memories, shift registers, or binary digital counters.

Referring now to FIG. 1 of the drawing, a circuit component enclosed within a dot-dash line and identified by the reference number 9 comprises a digital circuit interconnected to operate as a "missing pulse" detector or "retriggerable multi-vibrator" of the type disclosed in FIG. 1 of U.S. Pat. No. 4,097,812, issued June 27, 1978, and assigned to the assignee as the present application.

The retriggerable multi-vibrator circuit 9 of FIG. 1 functions to provide a first output signal condition on its output terminal 20 whenever pulses applied to an input terminal 10 occur at some repetition rate which is greater than the time constant of the circuit. If the pulses applied to the input terminal 10 occur at a repetition rate which is less than the time constant of the circuit, a different output signal condition appears on the terminal 20.

Input pulses or square wave signals supplied to the input terminal 10 are applied to the "set" input of a digital latch 11, which is set to a first stable condition by the negative-going pulse transition of any of the pulses appearing on the input terminal 10, if the flip-flop 11 already has not been set to such condition. In this condition, the "Q" output of the flip-flop 11 goes to its "high" stable state. Whenever this output is "high", the enable input of a digital counter 14, shown as an n-stage programmable counter, is high and permits the counter 14 to respond to clock pulses applied to it from a free-running clock multi-vibrator 15. In a typical case, the clock 15 may be a crystal controlled oscillator; but it is not necessary to use such a stable frequency source. The clock pulses also are at a substantially higher frequency than the frequency of the pulses applied to the input terminal 10. The digital counter 14 may be any one of a number of different types of digital counters, so long as the counter can be programmed to advance from a reset state to a final or output state in response to different numbers of clock pulses, depending upon the count to which the counter 14 has been programmed.

In the circuit of FIG. 1, the input terminal 10 also is connected to a "reset" (R) input of the digital counter 14. Anytime a negative-going pulse transition appears on the terminal 10, the digital counter 14 is cleared or reset to its initial count. Thereafter, so long as a positive or "high" input is applied to the reset input of the counter 14, the counter continues to advance its count in response to the pulse transitions in the output waveform from the clock circuit 15.

Assume now that an input waveform such as illustrated in row C of FIG. 2 is applied to the terminal 10 of the circuit 9 of FIG. 1. The first negative going pulse transition in wave form C on the terminal 10 sets the flip-flop 11 to its "high" state, as shown in the waveform D of FIG. 2. This pulse also clears or resets the digital counter 14 to its zero count. Assume, also, that the time interval between the negative-going transitions in the waveform C of the signal applied on the terminal 10 is equal to or greater than the time interval required for the digital counter 14 to reach a maximum or preestablished count in response to the clock pulses applied to it, for example at a high relative frequency as shown in waveform B of FIG. 2. This produces a positive output pulse on an output lead 17 from the counter 14.

When such a positive or "high" output pulse is obtained on the lead 17 in response to attainment by the counter 14 of the maximum count to which it has been programmed (lead 17 is normally at a low potential), the pulse is inverted at the reset input of the flip-flop 11 to reset the flip-flop 11 to its second stable condition. In this condition the upper or "Q" output goes low. This, in turn, disables the counter 14 from counting any further in response to clock pulses applied to its input so long as this second stable condition of the flip-flop 11 exists. However, as illustrated in waveforms C and D of FIG. 2, the next negative going input pulse transition of the waveform C appearing on the input terminal 10 produces a positive output again from the flip-flop 11. This output applied to the reset input of the counter 14 resets the counter back to its initial count established by a programmable counter 30 or zero count; and, at the same time, the counter is enabled for operation by the positive or "high" potential applied to its enable input E. Consequently, the circuit commences a new cycle of operation, advancing the count of the counter 14 in response to each of the clock pulses of waveform B applied to it by the clock 15. As a result, the output wave form D of FIG. 2 appears on the output 20 of the circuit.

In FIG. 1, the circuit 9 is employed as a portion of a digital to analog converter which is readily implemented in an LSI integrated circuit form. The operation of this circuit is utilized by employing the circuit 9 as a pulse width modulator circuit to produce a pulse width modulation signal on the output terminal 20 which is directly proportional to the count programmed into the counter 14. This count, in turn, is directly determined by the digital number which is being decoded and, therefore, is directly proportional to such number. The minimum positive going pulse width of the pulses of the waveform D is determined by the pulse width of the pulses of wave form B applied by the clock circuit 15 to the counter 14. This minimum is represented by pulse "x" in waveform A to FIG. 2. The maximum pulse width is a steady state direct current level determined by the repetition rate of the input signals of waveform C applied to the terminal 10 of the circuit 9. This repetition rate is illustrated as distance y in the waveform A of FIG. 2.

If the repetition rate of the pulses applied to the terminal 10 is made exactly equal to a given number of minimum pulse widths of the clock pulses from the clock circuit 15 and further is related by a binary number $2^n$, where n is the binary number on which the digital to analog conversion is being performed, an extremely stable converting circuit results which also is readily implemented as a digital LSI circuit.

A particularly attractive application for such a circuit is in a television tuner using voltage synthesizer techniques. Such techniques rely on digital to analog converters for tuning to any one of the eighty-two possible television stations by either directly selecting such stations from a keyboard, or by operating a signal seek circuit digitally to move the system up or down to the next active channel. For such an application, n needs to be large (n=12 is a minimum); so that implementation of such conversion with a resistive ladder network is difficult.

To establish the repetition rate, y, of the circuit and relate that repetition rate to the clock rate at which the counter 14 is advanced, an n stage fixed counter 25 is connected to the clock signal output and is advanced in synchronism with the clock pulses applied to the counter 14. The output of the counter 25 then is connected to the input 10 of the circuit 9 to provide the input pulse signals shown in waveform C to the circuit 9.

The loading of variable digital or binary encoded numbers into the programmable counter 14 varies the time required to advance it from its reset condition until the output pulse appears on the lead 17. Since the number of stages of the counter 25 is equal to the maximum length or stages of the programmable counter 14, the system operates so that the circuit 9 is immediately turned off or stays on for a specific length of time determined by the digital number that is loaded into the counter 14. The minimum number for a "up" counter or the maximum number for a "down" counter produces a timing interval exactly equal to the repetition rate of the waveform C. For this condition, the output on the terminal 20 is a continuous high state (direct current level).

The number of direct current levels possible is determined by the number of steps (n) of the counter 14. By passing the output through a low-pass filter 27 (an integrator circuit), the direct current component may be extracted to produce the analog equivalent of the number loaded into the programmable counter 14. It is apparent that as different numbers are loaded into the counter 14, the time duration varies from each negative transition of the waveform C until the counter 14 times out to cause waveform D (the output waveform) to switch from a high level output to a low level output, thereby varying the duty cycle of the signal appearing on the output 20. This results in a direct digital to analog translation of an n-bit or n-digit word into any one of the corresponding $2^n$ analog voltage levels produced on the output terminal 28 of the system shown in FIG. 1.

The circuit shown in FIG. 1, and which has been described above, is entirely synchronous; so that it is no necessary to employ an accurate crystal clock if this is not desired. An accurate digital to analog conversion within the system itself results, since all of the frequencies are derived from the single clock 15. If two accurate clocks at the correct frequencies are available, however, the need for the n stage fixed counter 25 can be eliminated.

If the extra frequency from a system using two separate clocks to provide the signals of waveforms B and C is such that the lower frequency is lower than the repetition rate y based on the maximum n stage programming of the counter 14, the system still functions properly. In such an event, the maximum timing interval of the programmable counter 14 will time out rather than produce a constant DC level for that particular condition of operation. However, the extra time interval that the output on the terminal 20 is at the "low" level will be fixed; and, therefore, the only effect is to lower all of the possible $2^n$ levels in proportion. This is equivalent to a slight attenuation of the signal which can be made up by amplifier gain stages if necessary. A slightly more difficult filtering problem is present because the repetition rate is lower.

FIG. 1 also shows the manner in which the circuit which has been described thus far may be employed in a television receiver to permit direct programming from a digital keyboard for a specific channel, or to permit signal seek operation in either the "up" or "down" directions. To accomplish this, an additional n stage programmable counter 30 is provided. The outputs of the counter 30 are connected in parallel to the inputs of the counter 14 and are used to program the counter 14 in response to the loading of input information into the counter 30. This can be done either directly from a keyboard (not shown) or by closing one or the other of a pair of normally open switches 32 or 33, respectively connected to the "up" and "down" clock drive input terminals of the reversible counter 30. In some cases, it may be desirable to provide a resetting of the counter 30 to some initial or zero count every time one or the other of the switches 32 or 33 is closed; but this is not necessary since the count in the counter 30 can commence from any starting count.

To synchronize the operation of the stepping of the signal seek operation by means of the counter 30, when either of the switches 32 or 33 is closed, a frequency divider 35 is connected to the output of the counter 25 and supplies the signals to the switches 32 and 33. The division ratio of the divider 35 is selected to cause the change of count of the counter 30 to be at a rate sufficient to permit the tuning circuitry of a television receiver, with which the circuit of FIG. 1 is used, to settle down in response to each different step or count increment by the counter 30 before the next step comes. Whenever a desired channel is reached, as ascertained visually by the person using the system or automatically in response to the sensing of the presence of a transmitted television signal, the switch 32 or 33 which was closed to effect the signal seek operation may be opened, terminating stepping of the counter 30. When this is done, the programmable counter 14 remains set to the count attained by the counter 30 just prior to the opening of the switches 32 and 33. This produces a uniform pulse width modulated signal such as shown in waveform D to the filter 27. This, in turn, provides a stable analog tuning voltage to the television receiver when the system in used in this manner.

Reference now should be made to FIG. 3 which shows an alternative embodiment. The circuit of FIG. 3 is similar to the one shown in FIG. 1 but reduces the complexity of the filtering requirements for systems where the number of bits in the digital signals being converted is quite large. To accomplish this reduction in filtering complexity, some additional complexity is necessary in the digital electronics for producing the pulse width modulated output signal waveform. This additional complexity, however, in the digital circuit is readily implemented in a custom designed integrated circuit; so that in actual practice, the cost of the system on a per unit basis should be less than the cost of a system where a much more complicated filter is necessary.

In order to understand the reasoning underlying the circuit of FIG. 3, consider a situation which exists from expanding the possible number of digital signals to be decoded from sixteen to thirty-two. When this is done, the filtering of the low-pass filter 27 for those input signal waveforms is greatly increased in order to eliminate any AC effects in the output, or higher speed logic is required.

To minimize the demands on the filter 27 and still use low speed circuitry, the circuit of FIG. 3 includes, essentially, a mirror image of the portion of the circuit of FIG. 1, identified as the retriggerable multi-vibrator or missing pulse detector circuit portion 9. The components of this mirror image, which are comparable to the similar components of the circuit of FIG. 1, are identified by the same reference number added to the common base number 100. For example, the programmable counter 14 of FIG. 1 has an additional counterpart in the mirror image circuit of FIG. 3 in the form of the programmable counter 114. Similarly, the flip-flop 11 has a counterpart in the flip-flop 111, and so forth. In addition to this mirror image circuitry, three other circuit elements are added to effect the desired operation of the circuit of FIG. 3. These are a separate additional flip-flop 50, a pair of trigger circuits 51 and 52, an odd-/even number decoder 60, and an OR gate 70. In all other respects, the circuitry which is shown in FIG. 1 is utilized in the circuit of FIG. 3; and the same reference numbers are used for the same components of both circuits.

The digital or binary numbers to be converted to an analog signal are entered into the n stage counter 30 in the same manner described previously in conjunction with FIG. 1. This can be done either directly from a keyboard or microprocessor, or may be done by applying count "up" or count "down" pulses through one or the other of the switches 32 and 33 when the system is being used in a signal seek mode of operation or a stepping mode of operation. Instead of using programmable counters 14 and 114 with the same number of stages as the counter 30, however, the counters 14 and 114 each are constructed to have a total count capacity of half the count capacity of the counter 30. By way of example, if the counter 30 is capable of uniquely counting and providing outputs representative of thirty-two different binary numbers or digital numbers, each of the counters 14 and 114 has a capability of half this, namely sixteen different digital numbers. When a binary counter is used, this is accomplished by causing the counters 14 and 114 each to have one less stage than the n stages of the counter 30. To complete the system of FIG. 3 so that its operation is comparable to that of FIG. 1, it then is necessary to reduce the number of stages or the count capacity of the fixed counter 25 to equal the number of stages or count capacity of the counters 14 and 114. Accordingly, when all of the counters are binary counters, the counter 25 now has n−1 stages instead of the n stages indicated in the embodiment of FIG. 1.

In addition, an odd/even decoder 60 is connected between the outputs of the counter 30 and the inputs of the programmable counters 14 and 114. Only the odd numbers are decoded into the programmable counter 114, and only the even numbers are decoded into the programmable counter 14. Thus, if there is a total count capacity of thirty-two, for example, of the counter 30, there will be sixteen odd numbers and sixteen even numbers, each of which may be uniquely identified by the odd/even decoder 60. For example, the odd number 1 is decoded by the odd/even decoder 60 as the number 1 (the first odd number) to be stored in the programmable counter 114. If the n stage counter 30 is set to store a number corresponding to the digital number 3, this is the second odd number so that the odd/even decoder 60 would cause the programmable counter 114 to store the number 2 in it, and so on. A similar decoding is made by the odd/even decoder 60 for each of the even numbers (2, 4, 6, etc.) which, in turn, are stored in the programmable counter 14 as "even" numbers 1, 2, 3, etc., respectively. Accordingly, there is a direct correlation between whatever number is stored in the counters 114 and 14 with the numbers stored in the counter 30.

In addition, it should be noted that for any given number in either of the odd or the even counters 114 and 14, the highest number stored (whether it is odd or even) is in one of the counters and the other counter stores the counterpart of the next lower number in the sequence of possible numbers which can be decoded in the counter 30. For example, if the counter 30 stores the number 5, the counter 114 stores the number 3 (since the number 5 is the third odd number) and the programmable counter 14 stores the number 2 (representative of the number 4, which is the next lower even number to the number being decoded). The reason for this, and the manner of the circuit operation, will become apparent from a description of that operation in the following paragraphs.

The fixed counter 25 of FIG. 3 produces a signal waveform of the type illustrated in waveform C of FIG. 2, as described previously in conjunction with FIG. 1. The number of stages of this binary counter is selected to be equal to the number of stages in both of the binary counters 14 and 114, so that the repetition rate of the signals applied to the inputs of the retriggerable multivibrator circuits, shown in FIG. 3, is correlated with the maximum pulse width attainable from either of these circuits in the same manner as it is in the circuit of FIG. 1.

The counter 25 applies trigger pulses to the flip-flop 50, which is a J-K flip-flop or divide-by-two frequency divider, which produces a symmetrical signal waveform on each of its two outputs (one hundred eighty degrees out of phase with one another) at half the frequency of the signals applied to it from the output of the fixed counter 25. The operation of the system in all other respects is exactly the same as described previously except that the input signals applied to the inputs 10 and 110 are obtained from the respective outputs of the trigger circuits 51 and 52 driven by the flip-flop 50. For example, when the first trigger transition is applied to the input terminal of the flip-flop 111, the programmable counter 114 is reset to its initial count and the flip-flop 111 is "set" to enable the counter 114 to respond to the clock pulses applied to it from the output of the clock 15 to commence counting.

The counting rate is such that the programmable counter 114 counts through to its maximum count at the repetition rate of the signal from the output of the counter 25 in the same manner described above in conjunction with FIG. 1. This produces a variable duty cycle output signal which is passed through the OR gate 70 to the low-pass filter 28. At the end of the first full cycle from the fixed counter 25, the flip-flop 50 changes state to leave the counter 114 and the flip-flop 111 in their "reset" condition of operation, but the flip-flop 11 then is enabled and the counter 14 is reset to commence its cycle of operation. The counter 14 then commences running under control of the clock pulses applied to it by the clock 15; and it times out within one full cycle of the operation of the fixed counter 25 to produce a pulse width modulated output pulse through the OR gate 70 to the low-pass filter 27.

So long as no new number is loaded into the programmable counters 14 and 114, this cycle of operation continues to be repeated, with the waveforms supplied to the filter 27 being supplied first from the odd number programmable counter 114, then the even number programmable counter 14, back to the odd number programmable counter 114, and so on. As a consequence, the filter 27 does not need to be nearly as complex as it otherwise would have to be to decode the large digital number potentials since a shorter duty cycle is accomplished between the alternating variable duty cycle signal waveforms obtained from the programmable counters 14 and 114. The filtering needed in our example is for sixteen (16) signals (levels) even though we achieve a resolution of thirty-two (32) levels.

Any time the number is changed in the counter 30, the odd/even decoder 60 operates to supply new numbers to at least one, and often both, of the counters 14 and 114. If the number being decoded is an even number, the counter 14 is set to the highest count corresponding to that even number and the counter 114 is set to store its representation of the next lower odd number. For example, number 8 is stored in the counter 14 for the even number 16 in the counter 30, as described above, and the counter 114 also stores number 8, representative of the next lower odd number 15. This is a unique combination producing a unique output voltage from the low-pass filter 27 corresponding to that decoded number. If a change of just one number then is made in the counter 30 to decode the number 17, the programmable counter 114 is set to store the number 9 (the next higher odd number); but no change is made in the state of the programmable counter 14, which continues to store the next lower even number (number 8 representative of digital number 16). Thus, a different voltage is obtained from the output of the low-pass filter 27, but the filtering requirements are not nearly so stringent as they would have to be if a single programmable counter 14, of the type shown in FIG. 1, were used to decode all of a possible relatively large number of digital input signals.

The other portions of the circuit shown in FIG. 3 operate in the same manner as the same portions described in conjunction with FIG. 1, so that no further discussion of those portions of the circuit is considered necessary here.

Also, the technique indicated in FIG. 3 can be extended to use 3, 4, or more circuits like the circuit 9 of FIG. 1 rather than just two as in FIG. 3. This requires proportionally less filtering than the circuit of FIG. 3 for a given precision (number of levels) required from the converter.

The foregoing description and the drawings are directed to preferred embodiments of the invention which are to be considered as illustrative of the invention and not as specifically limiting the scope of the invention. Various changes and modifications will occur to those skilled in the art without departing from the true scope of the invention.

I claim:

1. A digital to analog converter comprising:

first and second time interval measuring means, each having an input and an output and respectively including therein first and second multi-stage programmable counters, said time interval measuring means each providing a first output state on the output thereof when the interval between input pulses applied to the input thereof is less than a first predetermined amount and providing a second output state on the output thereof whenever the interval between such input pulses is more than a first predetermined amount;

means in each of said first and second time interval measuring means responsive to input pulses applied to the respective inputs thereof for resetting the respective programmable counter therein to a predetermined reset condition;

means for supplying clock pulses coupled with said first and second counters for advancing said counters from initial conditions to output pulse producing conditions in response to a predetermined number of clock pulses, such predetermined number of pulses being the number of pulses necessary to establish said interval of said first predetermined amount;

fixed counter means coupled between said means for supplying clock pulses and the inputs of said first and second time interval measuring means for supplying input pulses at a fixed frequency lower than the frequency of said clock pulses to the inputs of said first and second time interval measuring means, the pulses applied to the input of said first time interval means being 180 degrees out of phase with the input pulses applied to the input of said second time interval measuring means;

a fourth counter, the stages of which are coupled with said first and second programmable counters in a predetermined manner for programing said first and second programmable counters with a digital number to be converted, said number corresponding to the initial conditions, and said fourth counter having at least one input for changing the count therein in response to pulses applied thereto; and frequency divider means coupled between the output of said fixed counter and the input to said fourth counter to supply pulses to said fourth counter at a predetermined frequency lower than said fixed frequency, whereby the number of clock pulses required to advance said first and second counters from the initial conditions thereof to the output pulse producing condition is proportional to the digital number being converted.

2. The combination according to claim 1 further including an "up" switch and a "down" switch; and wherein said fourth counter is a reversable counter having first and second inputs comprising a forward count input and a reverse count input, respectively, and said pulses applied through said divider means are coupled to said "up" and "down" switches, either one of which may be closed at any given time.

3. The combination according to claim 2 further including filter means coupled with the output of said first means for producing an analog voltage corresponding to the duty cycle of the signals appearing on the output of said first means.

* * * * *